(12) United States Patent
Fang et al.

(10) Patent No.: US 11,316,130 B2
(45) Date of Patent: Apr. 26, 2022

(54) DISPLAY PANEL AND DISPLAY DEVICE HAVING LOWER AND UPPER THROUGH HOLES

(71) Applicant: WUHAN CHINA STAR OPTOELECTRONICS SEMICONDUCTOR DISPLAY TECHNOLOGY CO., LTD., Wuhan (CN)

(72) Inventors: Liang Fang, Wuhan (CN); Ding Ding, Wuhan (CN)

( * ) Notice: Subject to any disclaimer, the term of this patent is extended or adjusted under 35 U.S.C. 154(b) by 131 days.

(21) Appl. No.: 16/629,319

(22) PCT Filed: Aug. 28, 2019

(86) PCT No.: PCT/CN2019/103088
§ 371 (c)(1),
(2) Date: Jan. 8, 2020

(87) PCT Pub. No.: WO2020/252915
PCT Pub. Date: Dec. 24, 2020

(65) Prior Publication Data
US 2021/0408457 A1    Dec. 30, 2021

(30) Foreign Application Priority Data
Jun. 20, 2019    (CN) .......................... 201910536479.3

(51) Int. Cl.
*H01L 51/00* (2006.01)
*H01L 51/52* (2006.01)
*H01L 27/32* (2006.01)
*H01L 33/12* (2010.01)
(Continued)

(52) U.S. Cl.
CPC ...... *H01L 51/5253* (2013.01); *H01L 51/0097* (2013.01); *H01L 51/5281* (2013.01); *G02F 1/133528* (2013.01); *H01L 27/3244* (2013.01); *H01L 33/12* (2013.01); *H01L 51/5293* (2013.01); *H01L 2251/5338* (2013.01)

(58) Field of Classification Search
CPC ............ H01L 51/5253; H01L 51/5281; H01L 51/0097; H01L 51/5293; H01L 2251/5338; H01L 27/3244; G02F 1/133528
See application file for complete search history.

(56) References Cited

U.S. PATENT DOCUMENTS 6,999,139 B2      2/2006  Kim et al.
10,564,479 B2 *   2/2020  Nishiwaki ......... G02F 1/133528
10,672,841 B2 *   6/2020  Kim ..................... H01L 27/3246
(Continued)

FOREIGN PATENT DOCUMENTS

CN          107359185       11/2017
CN          107808606        3/2018
(Continued)

*Primary Examiner* — Ida M Soward

(57) ABSTRACT

The present invention provides a display panel. At least one first buffer layer is disposed between the base layer and the thin film transistor layer. At least one second buffer layer is disposed between the functional layer and the polarizer. The first buffer layer and the second buffer layer use hollow designs in the transparent displaying region and can reduce stress generated from cutting a hole, improve protection for the display panel and finally improve reliability of the display device.

10 Claims, 4 Drawing Sheets

(51) Int. Cl.
    *G02F 1/133*     (2006.01)
    *G02F 1/1335*     (2006.01)

(56) References Cited

U.S. PATENT DOCUMENTS

| | | | |
|---|---|---|---|
| 10,818,874 B2* | 10/2020 | Park | H01L 27/3272 |
| 2016/0172633 A1* | 6/2016 | Ahn | H01L 27/3272 |
| | | | 257/40 |
| 2016/0293687 A1* | 10/2016 | Chang | H01L 27/326 |
| 2020/0117034 A1 | 4/2020 | Yin et al. | |
| 2020/0150487 A1* | 5/2020 | Zhou | G02F 1/133514 |
| 2020/0193125 A1* | 6/2020 | Kim | H01L 51/5237 |
| 2021/0028406 A1* | 1/2021 | Sun | H01L 27/3234 |

FOREIGN PATENT DOCUMENTS

| | | |
|---|---|---|
| CN | 108885376 | 11/2018 |
| CN | 109148517 | 1/2019 |
| CN | 109545833 | 3/2019 |
| CN | 109767699 | 5/2019 |

\* cited by examiner

DISPLAY PANEL AND DISPLAY DEVICE HAVING LOWER AND UPPER THROUGH HOLES

FIELD OF INVENTION

The present invention relates to a field of displays, especially to a display panel and a display device.

BACKGROUND OF INVENTION

An important function of an organic light emitting diode (OLED) display device is a camera function. At present, a mainstream technology designs a device with a camera function around a peripheral non-displaying region of the display device. Such design has a great shortage that an integrity of the display device is low and an effective displaying region is drastically reduced.

In the prior art, a way for increasing an effective displaying region of a display device is a design of a under-screen camera. In general, a camera assembly is designed in a displaying region, and a corresponding camera region has a displaying function, which is so-called "full screen" display technology. However, the under-screen camera technology has a lower transmittance due to film structures such as a array substrate, a light emitting layer, and a polarizer, which results in an undesirable image quality for users.

SUMMARY OF INVENTION

Technical Issue

In general, an under-screen camera design lowers a displaying pixel density of a corresponding camera region, i.e., film layer densities of an array structure (TFT) and a light emitting layer are lower than a density of a main displaying region, and the film layers such as a base layer and a polarizer are formed with holes corresponding to a camera region; a hole forming method can be can be a laser cutting method, a mechanical cutting method or other cutting methods that are able to achieve forming a hole. However, any one of cutting methods generates cutting press during cutting, and existence of such stress has a greater risk to other film layers having no need of cutting, which influences reliability of the display device.

Therefore, a new display panel is urgently desired for reducing a cutting stress during cutting the display panel to improve reliability of the display panel.

Technical Solution

An objective of the present invention is to provide a display panel and a display device that dispose a buffer layer between a film layer to be cut and a film layer to be protected. The buffer layer employs a hollow design in the transparent displaying region and can reduce stress generated from cutting a hole, improve protection for the display panel and finally improve reliability of the display device.

To be able to achieve the above objective, the present invention provides a display panel comprising a main displaying region, a transparent displaying region, and a peripheral region; the main displaying region surrounding the transparent displaying region, the peripheral region located under the main displaying region; the display panel comprising: a base layer; a thin film transistor layer disposed on the base layer; a functional layer disposed on the thin film transistor layer; and a polarizer disposed on the functional layer; wherein at least one first buffer layer is disposed between the base layer and the thin film transistor layer; wherein at least one second buffer layer is disposed between the functional layer and the polarizer; wherein in the transparent displaying region, a first through hole is defined in the base layer, a second through hole is defined in the polarizer, and the first through hole corresponds to the second through hole.

Furthermore, a shape of the first through hole is circle, rectangle, or polygon; and a shape of the second through hole is circle, rectangle, or polygon.

Furthermore, material of the first buffer layer and the second buffer layer comprises transparent organic photoresist material.

Furthermore, a pixel density of the transparent displaying region is less than a pixel density of the main displaying region.

Furthermore, in the transparent displaying region, the first buffer layer comprises a first hollow region; the first hollow region corresponds to the first through hole; a shape of the first hollow region comprises circle, rectangle, and polygon; and a diameter of the first hollow region is greater than a diameter of the first through hole.

Furthermore, in the transparent displaying region, the second buffer layer comprises a second hollow region; the second hollow region corresponds to the second through hole; a shape of the second hollow region comprises circle, rectangle, and polygon; and a diameter of the second hollow region is greater than a diameter of the second through hole.

Furthermore, the display panel further comprises a third buffer layer; the third buffer layer disposed on the first buffer layer; in the transparent displaying region, a first recess defined in the first buffer layer and corresponding to the first through hole, the first recess comprising a first opening, and a direction of the first opening being away from the base layer; a third recess defined in the third buffer layer and corresponding to the first through hole, the third recess comprising a third opening, and a direction of the third opening being away from the thin film transistor layer; and the third opening connected to the first opening.

Furthermore, the display panel further comprises a fourth buffer layer; the fourth buffer layer disposed on the second buffer layer; in the transparent displaying region, a second recess defined in the second buffer layer and corresponding to the second through hole, the second recess comprising a second opening, and a direction of the second opening being away from the base layer; a fourth recess defined in the fourth buffer layer and corresponding to the second through hole, the fourth recess comprising a fourth opening, and a direction of the fourth opening being away from the thin film transistor layer; and the fourth opening connected to the second opening.

Furthermore, material of the third buffer layer and the fourth buffer layer comprises transparent organic photoresist material; a dimension and a shape of the first opening are the same as a dimension and a shape of the third opening; a dimension and a shape of the second opening are the same as a dimension and a shape of the fourth opening; the shape of the first opening comprises circle, rectangle, and polygon; the shape of the second opening comprises circle, rectangle, and polygon; the shape of the third opening comprises circle, rectangle, and polygon; and the shape of the fourth opening comprises circle, rectangle, and polygon.

The present invention provides a display device comprising the display panel and a camera module, and the camera module is disposed under the display panel and corresponds to the transparent displaying region.

Advantages

The present invention provides a display panel and a display device. A transparent displaying region of the display panel employs a design of low pixel density and can increase effective displaying area of the display device to achieve full screen technology. By disposing a new buffer layer between a film layer to be cut and a film layer to be protected with the buffer layer employing a hollow design in the transparent displaying region, an influence of stress generated from cutting a hole to a protective film is reduced and reliability of the display device is improved.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

Figure 1:
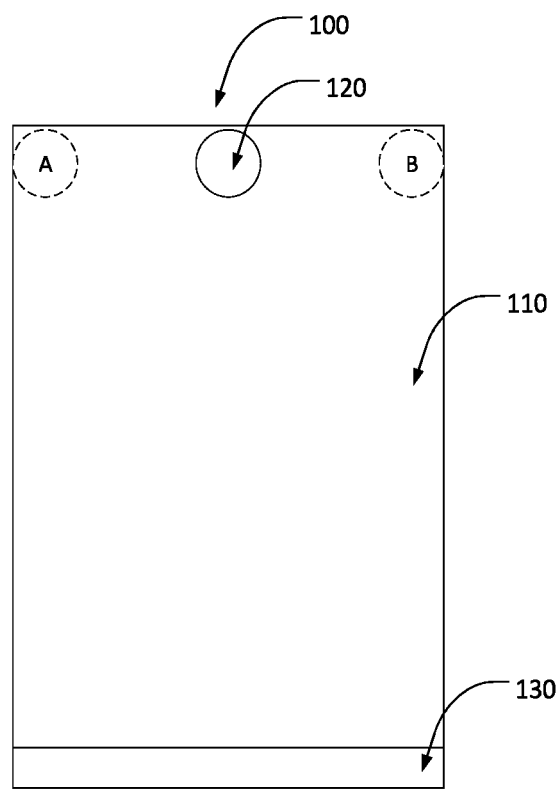
FIG. 1 is a schematic plane view of a display panel of an embodiment of the present invention.

display panel 100, 100a, display device 10; camera module 11;

main displaying region 110, 110a, transparent displaying region 120, 120a; peripheral region 130, 130a;

base layer 101, 101a; first buffer layer 102, 102a;

thin film transistor layer 103, 103a; functional layer 104, 104a;

second buffer layer 105, 105a; polarizer 106, 106a;

third buffer layer 107a; fourth buffer layer 108a; first hollow region 1021;

second hollow region 1051; first recess 1022a; second recess 1052a;

third recess 1071a; fourth recess 1081a; first opening 1023a;

second opening 1053a; third opening 1072a; fourth opening 1082a;

first through hole 1011, 1011a, second through hole 1061, 1061a.

DETAILED DESCRIPTION OF PREFERRED EMBODIMENTS

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The present invention may be described in details in many different forms, and the present invention should not be construed as merely a specific embodiment as set forth herein. The present invention provides embodiments for explaining practical applications of the present invention such that a person of ordinary skill in the art can understand the various embodiments of the present invention and various modifications suitable for the particular intended application.

With reference to FIG. 1, the present invention provides a display panel 100 of an embodiment comprising a main displaying region 110, a transparent displaying region 120, and a peripheral region 130. A pixel density of the transparent displaying region 120 is less than a pixel density of the main displaying region 110. The transparent displaying region 120 is located above a middle of the display panel 100, and can be located on a location A and a location B marked with broken lines in FIG. 1.

The main displaying region 110 surrounds the transparent displaying region 120. The peripheral region 130 is located under the main displaying region 110. The main displaying region 110 and the transparent displaying region 120 are configured for light emitting and displaying of the display panel 100. A shape of the transparent displaying region 120 is circle, rectangle, or polygon.

Figure 2:
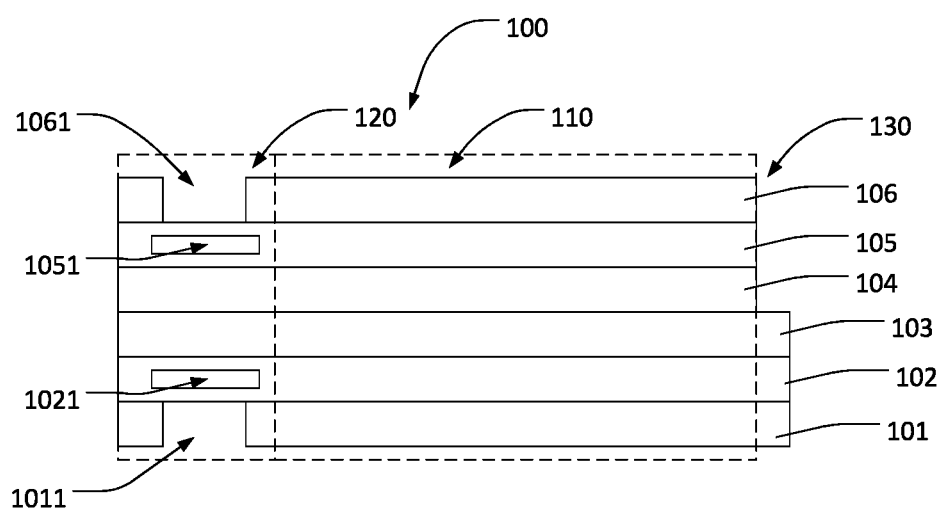
FIG. 2 is a schematic structural view of a display panel of an embodiment of the present invention.

With reference to FIG. 2, the display panel 100 comprises a base layer 101, a first buffer layer 102, a thin film transistor layer 103, a functional layer 104, a second buffer layer 105, and a polarizer 106.

Material of the base layer 101 is polyimide such that the base layer 101 has flexibility.

In the transparent displaying region 120, a first through hole 1011 is defined in the base layer 101. A hole forming method can be a laser cutting method, a mechanical cutting method or other cutting methods that are able to achieve forming a hole. A shape of the first through hole 1011 is circle, rectangle, or polygon.

The first buffer layer 102 is disposed on the base layer 101. Material of the first buffer layer 102 comprises transparent organic photoresist material.

In the transparent displaying region 120, the first buffer layer 102 comprises a first hollow region 1021. The first hollow region 1021 corresponds to the first through hole 1011. More specifically, the first hollow region 1021 corresponds to the first through hole 1011 along an upright direction, or both the first hollow region 1021 and the first through hole 1011 are disposed on an upright direction. A shape of the first hollow region 1021 is circle, rectangle, or polygon. A diameter of the first hollow region 1021 is greater than a diameter of the first through hole 1011.

The structure of the first buffer layer 102 can reduce influence of stress generated from cutting the first through hole 1011 to a protective film layer and improve reliability of the display panel 100.

The thin film transistor layer 103 is disposed on the base layer 101. The thin film transistor mainly functions as a switch for drive the functional layer 104 to emit light and display.

The thin film transistor layer 103 comprises a plurality of metal wires, a density of metal wires of the light transmissive displaying region is less than a density of metal wires of the main displaying region 110 such that more light can pass through the transparent displaying region 120.

The functional layer 104 is disposed on the thin film transistor layer 103. The functional layer 104 comprises a first electrode, a hole injection layer, a hole transport layer, a light emitting layer, an electron transport layer, an electron injection layer, and a second electrode. Because a specific structure of the functional layer 104 does not belong to the points of the present invention, structures of each layer of the functional layer 104 are not shown in the figures.

A pattern density of a metal film layer of the functional layer 104 of the transparent displaying region 120 is less than a pattern density of a metal film layer of the functional layer 104 of the main displaying region 110 such that more light can pass through the transparent displaying region 120.

The hole injection layer is disposed on the first electrode; the hole transport layer is disposed on the hole injection layer; the light emitting layer is disposed on the hole transport layer; the electron transport layer is disposed on the light emitting layer; the electron injection layer is disposed on the electron transport layer; and the second electrode is disposed on the electron injection layer. In an embodiment, the first electrode is an anode, and material thereof is indium tin oxide; the second electrode is a cathode, and material thereof is one of lithium fluoride and aluminum.

The polarizer 106 is disposed on the functional layer 104. In the transparent displaying region 120, a second through hole 1061 is defined in the polarizer 106. The second through hole 1061 corresponds to the first through hole 1011. the second through hole 1061 hole forming method can be a laser cutting method, a mechanical cutting method or other cutting method that is able to achieve forming a hole. A shape of the second through hole 1061 is circle, rectangle, or polygon.

At least one second buffer layer 105 is disposed between the functional layer 104 and the polarizer 106. Material of the second buffer layer 105 comprises transparent organic photoresist material.

In the transparent displaying region 120, the first buffer layer 102 comprises a first hollow region 1021. A shape of the first hollow region 1021 is circle, rectangle, or polygon. A diameter of the first hollow region 1021 is greater than a diameter of the first through hole 1011.

Disposing the first buffer layer 102 and disposing the first hollow region 1021 on the first buffer layer 102 can reduce stress generated from cutting the first through hole 1011 to prevent influence to the protective film layer and improve reliability of the display panel 100. More specifically, the film layer to be protective is the thin film transistor layer 103.

In the transparent displaying region 120, the second buffer layer 105 comprises a second hollow region 1051. The second hollow region 1051 corresponds to the second through hole 1061. A shape of the second hollow region 1051 is circle, rectangle, or polygon. A diameter of the second hollow region 1051 is greater than a diameter of the second through hole 1061.

Disposing the second buffer layer 105 and disposing the second hollow region 1051 on the second buffer layer 105 can reduce influence of stress generated from cutting the second through hole 1061 to a protective film layer, improve reliability of the display panel 100. More specifically, the film layer to be protected is the functional layer 104.

In an embodiment, the first buffer layer 102 and the third buffer layer 107 are not limited in numbers, can be laminated structures to further reduce stress generated from cutting a hole.

Figure 3:
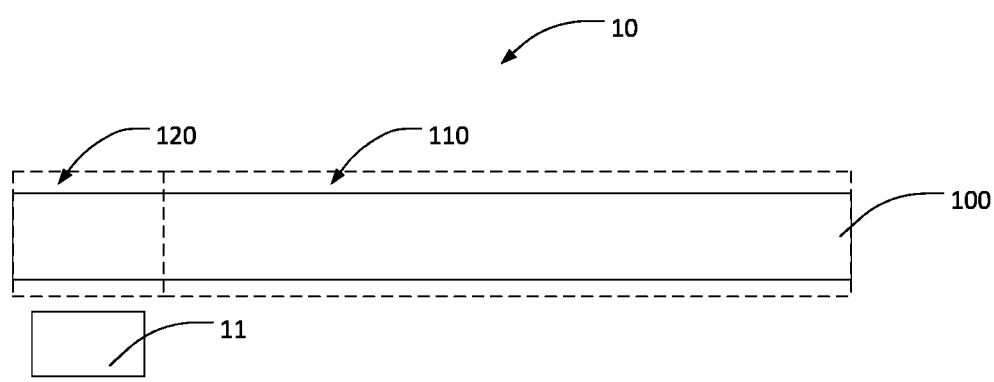
FIG. 3 is a schematic plane view of a display device of an embodiment of the present invention.

With reference to FIG. 3, the present invention also provides a display device 10 comprising the display panel 100 and a camera module 11. The camera module 11 is disposed under the display panel 100 and corresponds to the transparent displaying region 120.

The transparent displaying region 120 employs a design of low pixel density and can increase an effective displaying area of the display device 10 to achieve a full screen technology. By newly adding the first buffer layer 102 and the second buffer layer 105, the first buffer layer 102 is located between the film layer to be cut (base layer 101) and the film layer to be protected (thin film transistor layer 103), the second buffer layer is located between the film layer to be cut (polarizer 106) and the film layer to be protected (functional layer 104). The first buffer layer 102 and the second buffer layer 105 uses hollow designs in the transparent displaying region 120, further reduces influence of stress generated from cutting a hole to a protective film layer, and improves reliability of the display device 10.

Figure 4:
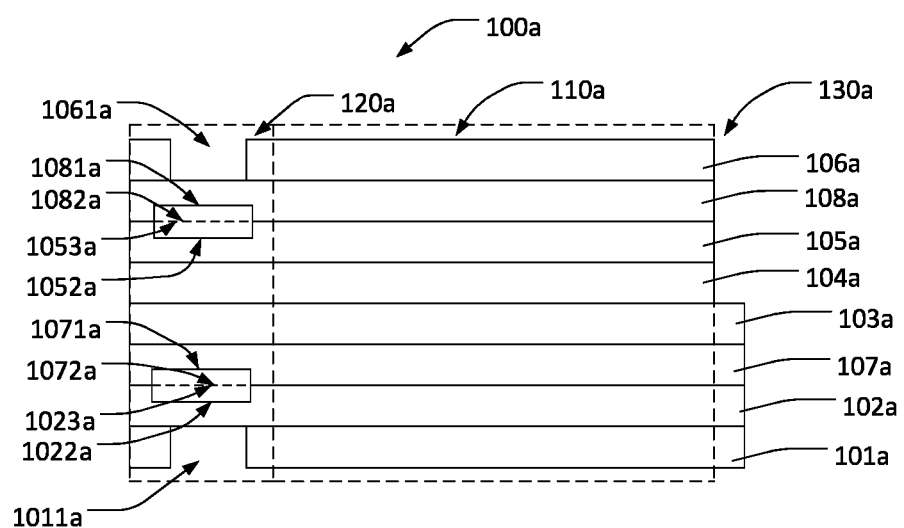
FIG. 4 is a schematic plane view of a display device of another embodiment of the present invention.

With reference to FIG. 4, the present invention also provides a display panel 100a of another embodiment further comprising a third buffer layer 107a and a fourth buffer layer 108a.

The third buffer layer 107a is disposed on the first buffer layer 102a. Material of the third buffer layer 107a comprises transparent organic photoresist material.

In the transparent displaying region 120a, a first recess 1022a is defined in the first buffer layer 102a and corresponds to the first through hole 1011a. The first recess 1022a comprises a first opening 1023a, and a direction of the first opening 1023a is away from the base layer 101a. A shape of the first opening 1023a comprises circle, rectangle, and polygon.

A third recess 1071a is defined in the third buffer layer 107a and corresponds to the first through hole 1011a. The third recess 1071a comprises a third opening 1072a. A direction of the third opening 1072a is away from the thin film transistor layer 103a. A shape of the third opening 1072a comprises circle, rectangle, and polygon.

The third opening 1072a is connected to the first opening 1023a, which can be called match or coincidence. A size and the shape of the third opening 1072a are the same as a size and the shape of the first opening 1023a. The third opening 1072a is disposed on the first opening 1023a. A diameter of the third opening 1072a is greater than a diameter of the first through hole 1011a.

In the present invention, the first buffer layer 102a and the third buffer layer 107a are a stacked structure such that the first recess 1022a and the third recess 1071a are spliced to form a hollow structure for reducing a stress generated from forming a hole to further protect the thin film transistor layer 103a.

The fourth buffer layer 108a is disposed on the second buffer layer 105a. Material of the fourth buffer layer 108a comprises transparent organic photoresist material.

In the transparent displaying region 120a, a second recess 1052a is defined in the second buffer layer 105a and corresponds to the second through hole. The second recess 1052a comprises a second opening 1053a, a direction of the second opening 1053a is away from the base layer 101a. A shape of the second opening 1053a comprises circle, rectangle, and polygon.

A fourth recess 1081a is defined in the fourth buffer layer 108a and corresponds to the second through hole 1061a. The fourth recess 1081a comprises a fourth opening 1082a. A direction of the fourth opening 1082a is away from the thin film transistor layer 103a. A shape of the fourth opening 1082a comprises circle, rectangle, and polygon.

The fourth opening 1082a is connected to the second opening 1053a, which can be called match or coincidence. A size and the shape of the fourth opening 1082a are the same as a size and the shape of the second opening 1053a. The fourth opening 1082a is disposed on the second opening 1053a. A diameter of the third opening 1072a is greater than a diameter of the second through hole 1061a.

In the present invention, the second buffer layer 105a are stacked with the fourth buffer layer 108a such that the second recess 1052a and the fourth recess 1081a are spliced to form a hollow structure for reducing a stress generated from forming a hole to further protect the functional layer 104a.

The technical scope of the present invention is not limited to the contents of the specification, a person of ordinary skill in the art can perform various variants and modifications to the embodiment without departing from the technical idea of the present invention. The variants and modifications shall be within the scope of the present invention.

What is claimed is:

1. A display panel, comprising a main displaying region, a transparent displaying region, and a peripheral region; the main displaying region surrounding the transparent displaying region, the peripheral region located under the main displaying region; the display panel comprising:
    a base layer;
    a thin film transistor layer disposed on the base layer;
    a functional layer disposed on the thin film transistor layer; and
    a polarizer disposed on the functional layer;
    wherein at least one first buffer layer is disposed between the base layer and the thin film transistor layer;
    wherein at least one second buffer layer is disposed between the functional layer and the polarizer;
    wherein in the transparent displaying region, a first through hole is defined in the base layer, a second through hole is defined in the polarizer, and the first through hole corresponds to the second through hole.

2. The display panel as claimed in claim 1, wherein
    a shape of the first through hole is circle, rectangle, or polygon; and
    a shape of the second through hole is circle, rectangle, or polygon.

3. The display panel as claimed in claim 1, wherein material of the first buffer layer and the second buffer layer comprises transparent organic photoresist material.

4. The display panel as claimed in claim 1, wherein a pixel density of the transparent displaying region is less than a pixel density of the main displaying region.

5. The display panel as claimed in claim 1, wherein
    in the transparent displaying region, the first buffer layer comprises a first hollow region;
    the first hollow region corresponds to the first through hole;
    a shape of the first hollow region comprises circle, rectangle, and polygon; and
    a diameter of the first hollow region is greater than a diameter of the first through hole.

6. The display panel as claimed in claim 1, wherein
    in the transparent displaying region, the second buffer layer comprises a second hollow region;
    the second hollow region corresponds to the second through hole;
    a shape of the second hollow region comprises circle, rectangle, and polygon; and
    a diameter of the second hollow region is greater than a diameter of the second through hole.

7. The display panel as claimed in claim 1 further comprising a third buffer layer;
    the third buffer layer disposed on the first buffer layer;
    in the transparent displaying region, a first recess defined in the first buffer layer and corresponding to the first through hole, the first recess comprising a first opening, and a direction of the first opening being away from the base layer;
    a third recess defined in the third buffer layer and corresponding to the first through hole, the third recess comprising a third opening, and a direction of the third opening being away from the thin film transistor layer; and
    the third opening connected to the first opening.

8. The display panel as claimed in claim 7, further comprising a fourth buffer layer;
    the fourth buffer layer disposed on the second buffer layer;
    in the transparent displaying region, a second recess defined in the second buffer layer and corresponding to the second through hole, the second recess comprising a second opening, and a direction of the second opening being away from the base layer;
    a fourth recess defined in the fourth buffer layer and corresponding to the second through hole, the fourth recess comprising a fourth opening, and a direction of the fourth opening being away from the thin film transistor layer; and
    the fourth opening connected to the second opening.

9. The display panel as claimed in claim 8, wherein
    material of the third buffer layer and the fourth buffer layer comprises transparent organic photoresist material;
    a dimension and a shape of the first opening are the same as a dimension and a shape of the third opening;
    a dimension and a shape of the second opening are the same as a dimension and a shape of the fourth opening;
    the shape of the first opening comprises circle, rectangle, and polygon;
    the shape of the second opening comprises circle, rectangle, and polygon;
    the shape of the third opening comprises circle, rectangle, and polygon; and
    the shape of the fourth opening comprises circle, rectangle, and polygon.

10. A display device comprising the display panel as claimed in claim 1, the display device further comprising a camera module disposed under the display panel and corresponding to the transparent displaying region.

* * * * *